(12) United States Patent
McDougall, Jr. et al.

(10) Patent No.: US 11,631,314 B2
(45) Date of Patent: *Apr. 18, 2023

(54) MAGNETIC FIELD DETECTION AND INTERACTION

(71) Applicant: Aclara Technologies LLC, St. Louis, MO (US)

(72) Inventors: Thomas Lee McDougall, Jr., Milton, NH (US); Charles Andrew Waters, Durham, NH (US)

(73) Assignee: Aclara Technologies LLC, St. Louis, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/847,934

(22) Filed: Jun. 23, 2022

(65) Prior Publication Data

US 2022/0327907 A1 Oct. 13, 2022

Related U.S. Application Data

(63) Continuation of application No. 17/167,978, filed on Feb. 4, 2021, now Pat. No. 11,393,322.

(60) Provisional application No. 62/970,973, filed on Feb. 6, 2020.

(51) Int. Cl.
| | | |
|---|---|---|
| *G01R 11/18* | (2006.01) | |
| *G08B 21/18* | (2006.01) | |
| *G01R 11/36* | (2006.01) | |
| *G01R 33/07* | (2006.01) | |
| *G01R 33/02* | (2006.01) | |

(52) U.S. Cl.
CPC ............ *G08B 21/182* (2013.01); *G01R 11/36* (2013.01); *G01R 33/0206* (2013.01); *G01R 33/07* (2013.01)

(58) Field of Classification Search
CPC combination set(s) only.
See application file for complete search history.

(56) References Cited

U.S. PATENT DOCUMENTS

| | | |
|---|---|---|
| 4,707,679 A | 11/1987 | Kennon et al. |
| 6,885,302 B2 | 4/2005 | Seal et al. |
| 7,218,223 B2 | 5/2007 | Seal et al. |
| 7,495,555 B2 | 2/2009 | Seal et al. |

(Continued)

OTHER PUBLICATIONS

PCT/US2021/016648 International Search Report and Written Opinion dated Apr. 22, 2021 (14 pages).

*Primary Examiner* — Alvaro E Fortich
(74) *Attorney, Agent, or Firm* — Michael Best & Friedrich LLP

(57) ABSTRACT

An electric utility meter including a Hall Effect sensor configured to sense a magnetic field proximate the electric utility meter. The electric utility meter also includes a controller having an electronic processor, the controller configured to receive a signal indicative of a magnitude of the magnetic field proximate the electric utility meter from the sensor, determine whether the magnitude of the magnetic field exceeds a first magnitude threshold and whether a threshold flag has been set, set the threshold flag when the threshold flag has not been set and the magnitude exceeds the first magnitude threshold, determine an amount of time for which the magnitude has exceeded the first magnitude threshold when the threshold flag has been set, and generate an alert indicative of a magnetic tamper event when the amount of time exceeds a time threshold.

20 Claims, 5 Drawing Sheets

(56) References Cited

U.S. PATENT DOCUMENTS

| | | |
|---|---|---|
| 2002/0161547 A1 | 10/2002 | Elliott et al. |
| 2004/0021568 A1* | 2/2004 | Seal .................... G01R 22/066 340/870.3 |
| 2004/0161548 A1 | 2/2004 | Seal et al. |
| 2015/0002134 A1* | 1/2015 | Ramirez ................ G01R 11/24 324/110 |
| 2016/0084632 A1 | 3/2016 | Zigovszki et al. |
| 2018/0038895 A1* | 2/2018 | Pambucol .............. G01R 11/24 |
| 2018/0052008 A1* | 2/2018 | Maman ................ G06V 10/141 |
| 2019/0036011 A1* | 1/2019 | Liu ...................... G01R 33/077 |

\* cited by examiner

MAGNETIC FIELD DETECTION AND INTERACTION

RELATED APPLICATIONS

This application claims the benefit of U.S. patent application Ser. No. 17/167,978, filed Feb. 4, 2021, and U.S. Provisional Patent Application No. 62/970,973, filed Feb. 6, 2020, the entire contents of which are hereby incorporated by reference.

FIELD

Embodiments relate to magnetic field detection and interaction as related to electric utility metering.

SUMMARY

Electric utility meters may be susceptible to tampering, which can lead to inaccuracies in power consumption measurements recorded by utility service providers. For example, tampering with electric utility meters via magnetic field saturation is a common method of reducing the power consumption measurements recorded by electric utility meters, causing revenue losses for the associated utility service providers. Placing an external magnet near an electric utility meter can cause the current transformers inside of the electric utility meter to become saturated, and thus, reduce the Kilowatt/Hour measurements recorded by the electric utility meter.

In one aspect, the application provides an electric utility meter including a sensor configured to sense a magnetic field proximate the electric utility meter and a controller having an electronic processor. The controller configured to receive, via the sensor, a signal indicative of a magnitude of the magnetic field proximate the electric utility meter, determine whether the magnitude of the magnetic field exceeds a first magnitude threshold, determine whether a threshold flag has been set, and set the threshold flag when the threshold flag has not been set and the magnitude exceeds the first magnitude threshold. The controller is further configured to determine an amount of time for which the magnitude has exceeded the first magnitude threshold when the threshold flag has been set, generate an alert indicative of a magnetic tamper event when the amount of time exceeds a time threshold, and clear the threshold flag when the magnitude does not exceed a second magnitude threshold, the second magnitude threshold being less than the first magnitude threshold.

In another aspect, the application provides a method for detecting an abnormality in a magnetic field proximate an electric utility meter. The method includes receiving, by a controller having an electronic processor, a signal indicative of a magnitude of a magnetic field proximate the electric utility meter from a sensor, determining, by the controller, whether a magnitude of the magnetic field exceeds a first magnitude threshold, determining, by the controller, whether a threshold flag has been set, and setting, by the controller, the threshold flag when the threshold flag has not been set and the magnitude exceeds the first magnitude threshold. The method further includes determining, by the controller, an amount of time for which the magnitude has exceeded the first magnitude threshold when the threshold flag has been set, generating, by the controller, an alert indicative of a magnetic tamper event when the amount of time exceeds a time threshold, and clearing the threshold flag when the magnitude does not exceed a second magnitude threshold, the second magnitude threshold being less than the first threshold.

In another aspect, the application provides an electric utility meter including a sensor configured to sense a magnetic field proximate the electric utility meter and a controller having an electronic processor. The controller is configured to receive, via the sensor, a signal indicative of a magnitude of a magnetic field proximate the electric utility meter, determine whether the magnitude of the magnetic field exceeds a first magnitude threshold, determine whether a threshold flag has been set, and set the threshold flag when the threshold flag has not been set and the magnitude exceeds the first magnitude threshold. The controller is further configured to determine an amount of time for which the magnitude has exceeded the first magnitude threshold when the threshold flag has been set, generate a first alert indicative of a magnetic tamper event when the amount of time exceeds a time threshold, and generate a second alert that indicates the magnetic tamper event is no longer present when the magnetic tamper event is no longer detected.

Before any embodiments are explained in detail, it is to be understood that the embodiments are not limited in their application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software-based devices, as well as a plurality of different structural components, may be utilized to implement the embodiments. For example, "servers," "computing devices," "controllers," "processors," etc., described in the specification can include one or more processing units, one or more computer-readable medium modules, one or more input/output interfaces, and various connections (e.g., a system bus) connecting the components.

Relative terminology, such as, for example, "about," "approximately," "substantially," etc., used in connection with a quantity or condition would be understood by those of ordinary skill to be inclusive of the stated value and has the meaning dictated by the context (e.g., the term includes at least the degree of error associated with the measurement accuracy, tolerances [e.g., manufacturing, assembly, use, etc.] associated with the particular value, etc.). Such terminology should also be considered as disclosing the range defined by the absolute values of the two endpoints. For example, the expression "from about 2 to about 4" also discloses the range "from 2 to 4". The relative terminology may refer to plus or minus a percentage (e.g., 1%, 5%, 10%, or more) of an indicated value.

Functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way but may also be configured in ways that are not explicitly listed.

Other aspects of the disclosure will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
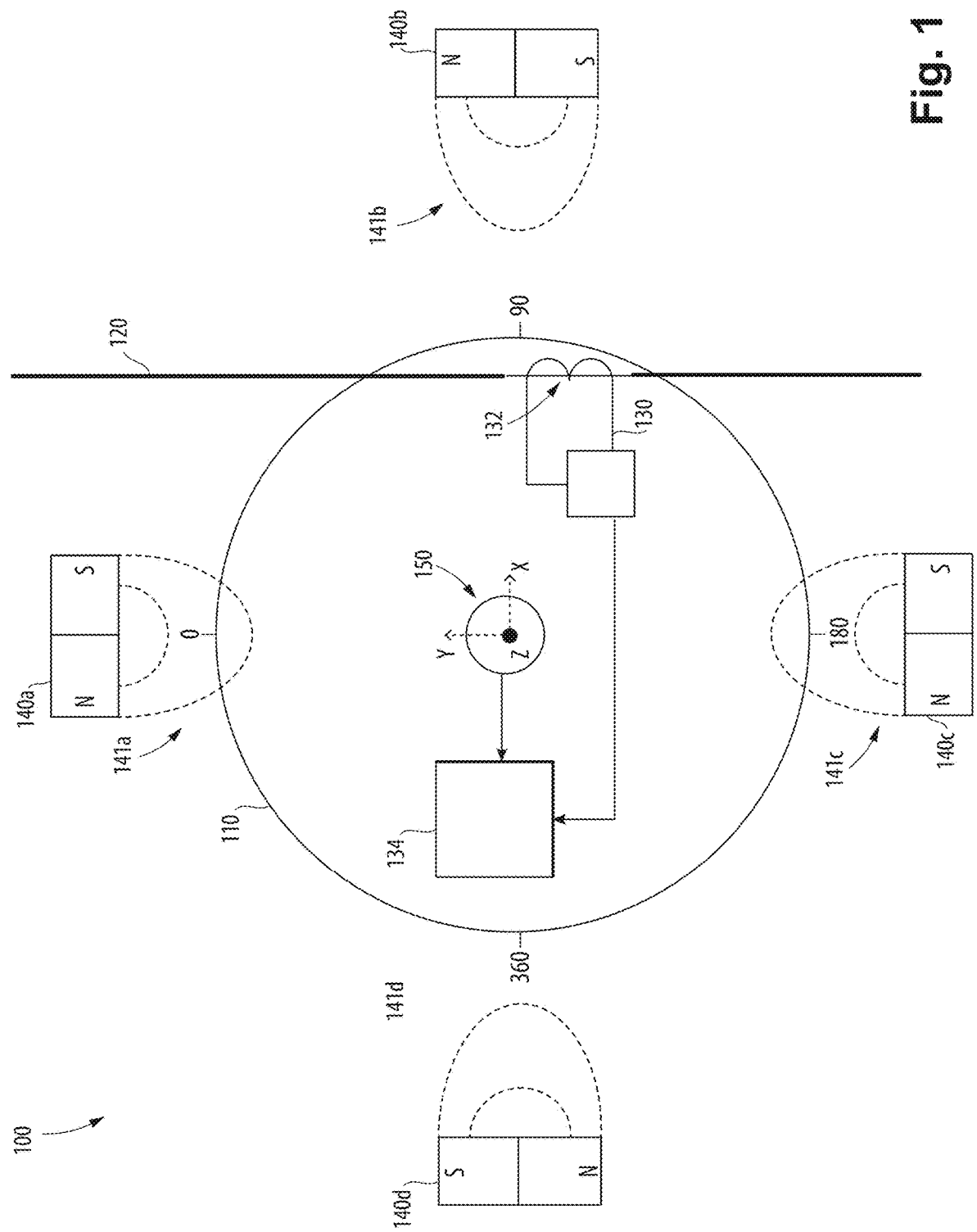
FIG. 1 illustrates a block diagram of an electric utility distribution system including an electric utility meter according to some embodiments.

FIG. 1 illustrates a block diagram of an electric utility distribution system 100 according to one embodiment. The electric utility distribution system 100 includes an electric utility meter 110 configured to measure an amount of electric power (for example, Kilowatt/Hour (KWH)) delivered by distribution line 120 to a load. In some embodiments, distribution line 120 delivers power to a residential load. In other embodiments, distribution line 120 delivers power to a commercial or industrial load.

Power consumed by the load is measured by metering electronics 130 included in electric utility meter 110. The metering electronics 130 may be mounted on a printed circuit board (PCB) and may include a current transformer 132 that measures (for example, indirectly) a primary current delivered, via distribution line 120, to the load by producing a small isolated secondary current proportional to the primary current. The secondary current proportional to the primary current is produced in a winding wire that surrounds a ferromagnetic core of the current transformer 132. The secondary current is measured by an ammeter and passed through a small resistor, creating a voltage signal that is converted to a digital signal by meter electronics 130. Controller 134 included in the electric utility meter 110 determines the power consumed by the load, for example, by multiplying the digital voltage signal by the secondary current value.

As mentioned above, current transformers may be susceptible to magnetic tampering, which is a method employed by electric utility consumers to reduce the power measurements read by electric utility meters. Referring to FIG. 1, placing external magnets 140 in proximity of the electric utility meter 110 may cause the ferromagnetic core of current transformer 132 to become saturated and incapable of accurately measuring power consumed by the load. External magnets 140 may be implemented as, but not limited to, neodymium magnets. Neodymium magnets are readily available for purchase and generate magnetic fields strong enough to interfere with the ability of current transformer 132 to accurately measure power consumption.

The electric utility meter 110 further includes a three-axis Hall Effect sensor 150 that may be centrally mounted on the PCB. The three-axis Hall Effect sensor 150 is configured to detect the presence of external magnetic fields within a 360-degree area surrounding the electric utility meter 110.

For example, with respect to the degree marks on the circumference of electric utility meter 110, the three-axis Hall Effect sensor 150 is configured to detect the presence of magnetic field 141a that is generated by the external magnet 140a positioned at 0 degrees and magnetic field magnetic field 141b that is generated by the external magnet 141b positioned at 90 degrees. In addition, the three-axis Hall Effect sensor 150 is configured to detect the presence of magnetic field 141c that is generated by the external magnet 140c positioned at 180 degrees and magnetic field 141d that is generated by the external magnet 140d positioned at 270 degrees.

It should be understood the positions of the external magnets 140 are merely selected for illustrative purposes, and may be positioned elsewhere. Moreover, the three-axis Hall Effect sensor 150 is capable of detecting the presence of a magnetic field generated by an external magnet positioned at any point surrounding the electric utility meter 110. Furthermore, although FIG. 1 illustrates the external magnets 140 as lying in the X-Y plane of the three-axis Hall Effect sensor 150, it should be understood that the three-axis Hall Effect sensor is capable of detecting the presence of magnetic fields generated by external magnets that are distanced from the electric utility meter in the Z-axis as well as the X-Y plane, as illustrated in FIG. 2.

Figure 2:
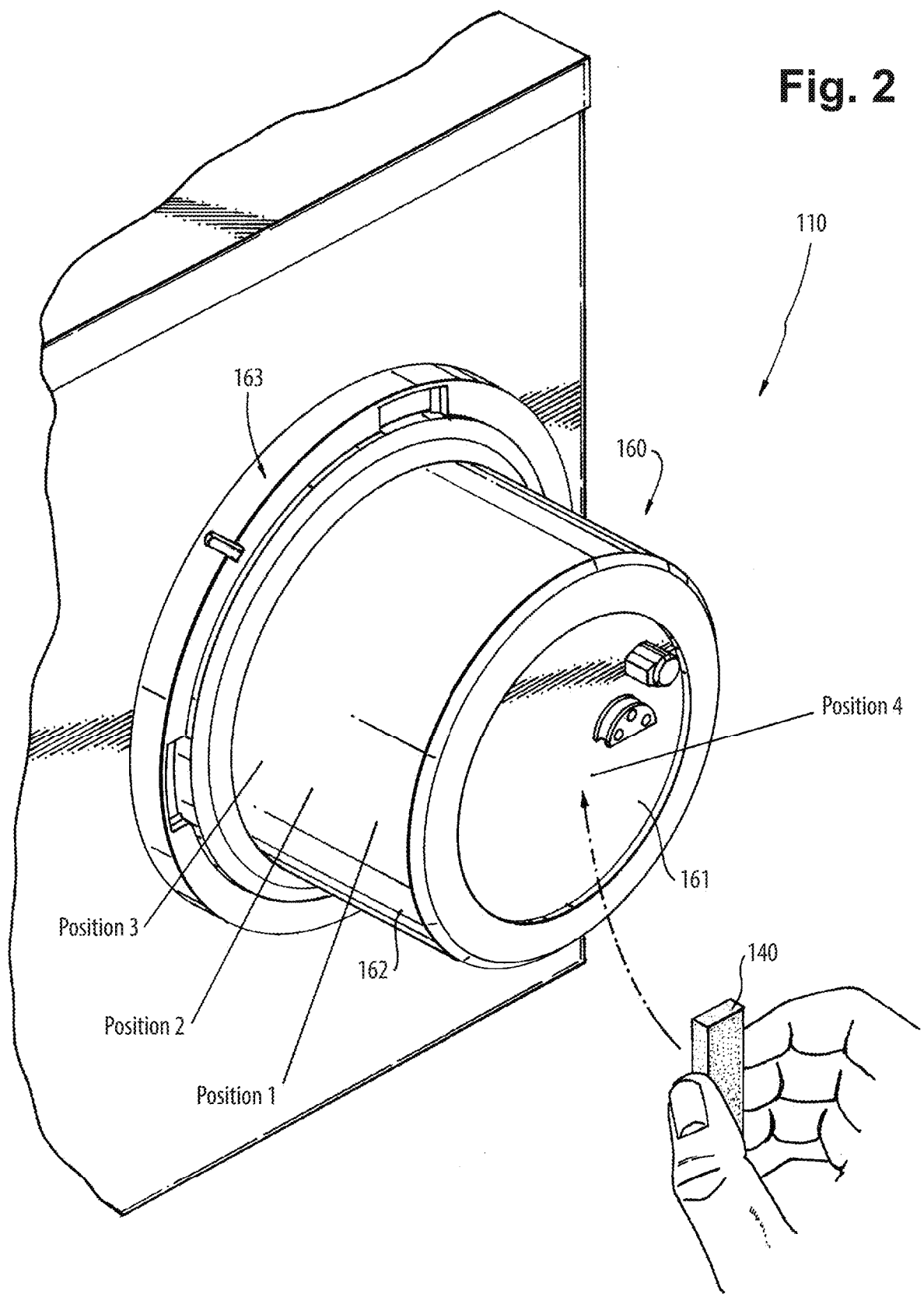
FIG. 2 illustrates a perspective view of the electric utility meter of FIG. 1 according to some embodiments.
Figure 3:
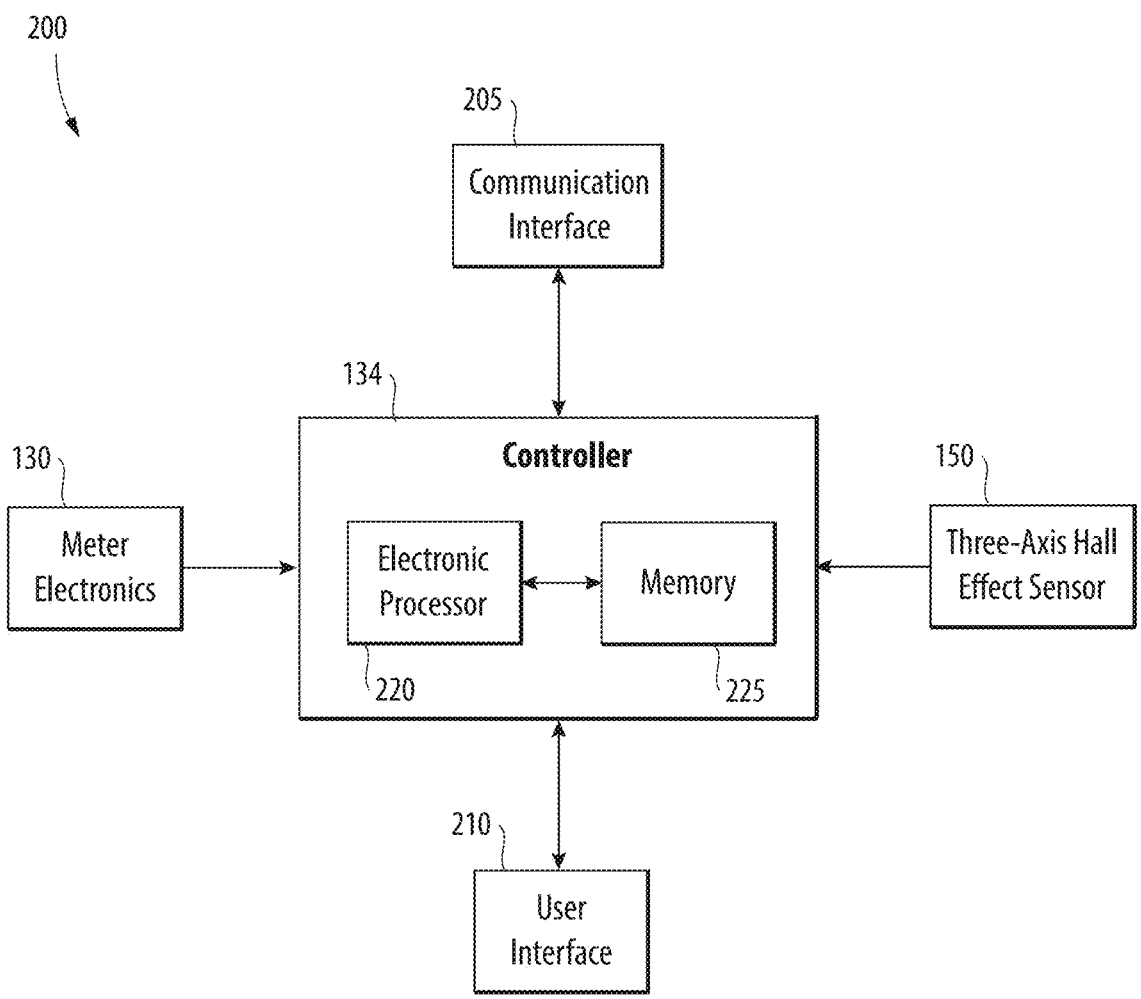
FIG. 3 is a block diagram of a control system of the electric utility meter of FIG. 1 according to some embodiments.

FIG. 2 illustrates a perspective view of electric utility meter 110 according to some embodiments. The electric utility meter 110 includes a housing 160 configured to protect the working components of the electric utility meter 110, such as meter electronics 130 and the three-axis Hall Effect sensor 150. The housing 160 includes a back plate 161, from which a side wall 162 extends vertically towards face plate 163 (FIG. 3). The three-axis Hall Effect sensor 150 (centrally located within the housing 160) is capable of detecting the presence of magnetic fields generated by external magnets 140 located at Position 1, Position 2, Position 3, and/or Position 4, wherein each position varies in distance along the sidewall 162 of the housing 160. In some embodiments, the three-axis Hall Effect sensor is configured to detect the presence of magnetic fields within a half sphere surrounding the meter.

FIG. 3 illustrates a block diagram of a control system 200 of the electric utility meter 110 according to some embodiments. The control system 200 includes the controller 134. The controller 134 is electrically and/or communicatively connected to a variety of modules or components of electric utility meter 110. For example, the controller 134 is connected to the meter electronics 130, the three-axis Hall Effect sensor 150, a communication interface 205, and a user interface 210.

The communication interface 205 is configured to provide communication between electric utility meter 110 and an external device (for example, a smart phone, a tablet, a laptop, etc.). In some embodiments, the communication interface 205 of electric utility meter 110 is configured to communicate with external devices operated by a utility service provider and/or a utility service customer. In such an embodiment, the electric utility meter 110 may communicate with the one or more external devices through a network. The network is, for example, a wide area network (WAN) (e.g., the Internet, a TCP/IP based network, a cellular network, such as, for example, a Global System for Mobile Communications [GSM] network, a General Packet Radio Services [GPRS] network, a Code Division Multiple Access [CDMA] network, an Evolution-Data Optimized [EV-DO] network, an Enhanced Data Rates for GSM Evolution [EDGE] network, a 3 GSM network, a 4GSM network, a Digital Enhanced Cordless Telecommunications [DECT] network, a Digital AMPS [IS-136/TDMA] network, or an Integrated Digital Enhanced Network [iDEN] network, etc.). In other embodiments, the network is, for example, a local area network (LAN), a neighborhood area network (NAN), a home area network (HAN), or personal area network (PAN) employing any of a variety of communications protocols, such as Wi-Fi, Bluetooth, ZigBee, etc. In yet another embodiment, the network includes one or more of a wide area network (WAN), a local area network (LAN), a neighborhood area network (NAN), a home area network (HAN), or personal area network (PAN).

The user-interface 210 may be configured to receive input from a service technician and/or output information to a customer or service technician concerning the electric utility meter 110. In some embodiments, user-interface 210 includes a display (for example, a primary display, a secondary display, etc.) and/or input devices (for example, touchscreen displays, a plurality of knobs, dials, switches, buttons, etc.). The display may be, for example, a liquid crystal display ("LCD"), a light-emitting diode ("LED") display, an organic LED ("OLED") display, an electroluminescent display ("ELD"), a surface-conduction electron-emitter display ("SED"), a field emission display ("FED"), a thin-film transistor ("TFT") LCD, etc.

In some embodiments, the controller 134 includes a plurality of electrical and electronic components that provide power, operational control, and protection to the components and modules within the controller 134 and/or the electric utility meter 110. For example, the controller 134 includes, among other things, an electronic processor 220 (for example, a microprocessor or another suitable programmable device) and a memory 225.

The memory 225 includes, for example, a program storage area and a data storage area. The program storage area and the data storage area can include combinations of different types of memory, such as read-only memory (ROM) and random-access memory (RAM). Various non-transitory computer readable media, for example, magnetic, optical, physical, or electronic memory may be used. The electronic processor 220 is communicatively coupled to the memory 225 and executes software instructions that are stored in the memory 225, or stored in another non-transitory computer readable medium such as another memory or a disc. The software may include one or more applications, program data, filters, rules, one or more program modules, and other executable instructions.

In some embodiments, the three-axis Hall Effect sensor 150 is configured to continuously and/or periodically sense the magnetic field proximate the electric utility meter 110. The three-axis Hall Effect sensor 150 may be configured to detect magnetic field data such as, but not limited to, magnetic field strength, magnetic field direction, the incidence angle at which the magnetic field passes through the electric utility meter 110, and a frequency associated with the magnetic field. The three-axis Hall Effect sensor 150 transmits the detected magnetic field data to the controller 134. In some embodiments, each transmission of magnetic field data from the three-axis Hall Effect sensor 150 to the controller 134 includes a time stamp.

The controller 134 is configured to continuously and/or periodically monitor the magnetic field strength data received from the three-axis Hall Effect sensor 150 for the occurrence of an abnormality indicative of magnetic field tampering in the magnetic field proximate the electric utility meter 110. For example, the controller 134 is configured to determine that an abnormality in the magnetic field proximate the electric utility meter 110 has occurred when the magnitude of the magnetic field strength exceeds a first magnetic field strength threshold value. The first magnetic field strength threshold value is user-defined and/or configurable. Other non-limiting examples of abnormalities in the magnetic field proximate the electric utility meter 110 may include a rapid detected change in direction of the magnetic field or an abnormal frequency associated with the magnetic field. In some embodiments, under normal operating conditions, wherein no external magnets are present, a weak 60 Hz magnetic field generated by distribution line 120 is present proximate the electric utility meter 110. In such embodiments, the controller 134 is configured to detect the presence of an abnormality when the frequency of the magnetic field proximate the electric utility meter 110 differs from 60 Hz by a predetermined threshold amount.

In some embodiments, in response to detecting the presence of an abnormality in the magnetic field proximate electric utility meter 110, the controller 134 is configured to initiate a fault timer. In addition, in response to detecting the presence of an abnormality in the magnetic field proximate the electric utility meter 110, the controller may further be configured to log an abnormality detection event in an event log stored in memory 225. When the detected abnormality is present for a predetermined period of time (for example, approximately one minute), the controller 134 is configured to determine that magnetic tampering is occurring and add a magnetic field tamper event to the event log. However, if the detected abnormality is present for a period of time that is less than the predetermined period of time, the controller 134 will not add a magnetic field tramper event to the event log. In some embodiments, when the abnormality is no longer detected by the controller 134, the controller 134 is further configured to log an abnormality cleared event in the event log. Therefore, the controller 134 is configured to avoid triggering false alarms associated with magnetic field tampering at the electric utility meter. Data included in the event log may be accessed by and/or provided to one or more external devices operated by a utility service provider and/or a utility service customer. For example, the controller 134 may be configured to transmit, by the communication interface 205, data included in the event log to the one or more external devices. Accordingly, users of the one or more external devices are operable to determine whether magnetic tampering has occurred based on the data included in the event log.

In some embodiments, the controller 134 is configured to determine that a detected abnormality in the magnetic field proximate electric utility meter 110 is no longer present when the magnitude of the magnetic field strength proximate the electric utility meter 110 decreases below a dropout, or second, magnetic field threshold value. In some embodiments, the second magnetic field threshold value is chosen to be a magnetic field strength value that is less than (for example, approximately 10% less than) the first magnetic field threshold value used for initially detecting the presence of an abnormality in the magnetic field. In such embodiments, the second magnetic field threshold value is chosen to be less than the first magnetic field threshold value to accommodate for changes occurring in the magnetic field proximate electric utility meter 110. Similar to the first magnetic field strength threshold value, the second magnetic field strength threshold value is also configurable and/or user defined.

The controller 134 may be further configured to generate an alert in response to detecting an abnormality in the magnetic field proximate the electric utility meter 110. In some embodiments, when the detected magnetic field abnormality is present for the predetermined period of time, the controller 134 is configured to transmit an alert signal to an external device (for example, an external device located at, or associated with the utility service provider). For example, the controller 134 may send a text message or email, via communication interface 205, that indicates the occurrence of magnetic field tampering to the external device associated with the utility service provider. In a similar manner, when the abnormality in the magnetic field proximate the electric utility meter 110 is no longer detected, the controller 134 may send a text message or email, via communication interface 205, that indicates the magnetic field tampering is no longer occurring to the external device associated with the utility service provider. In some embodiments, the controller 134 is further configured to output an alarm message to the display of user-interface 210 when the detected magnetic field abnormality is present for the predetermined period of time.

Figure 4:
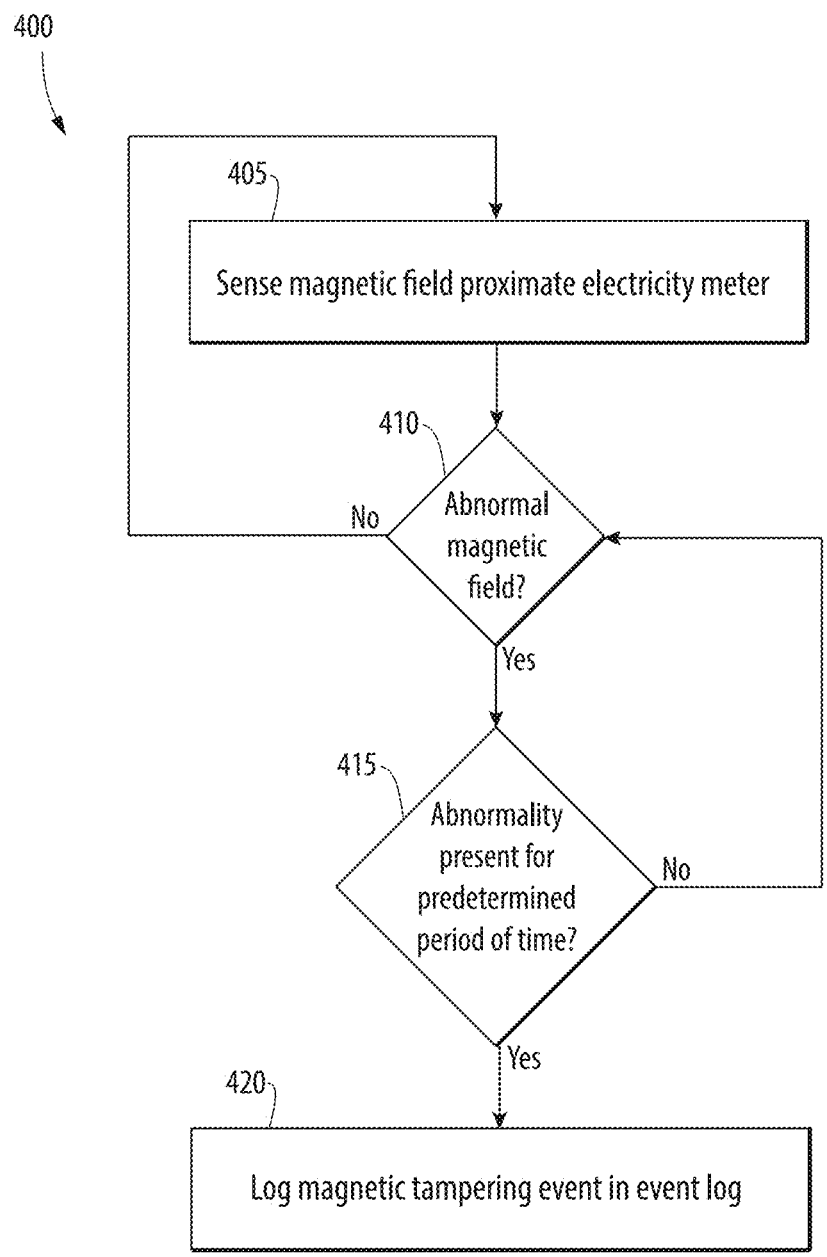
FIG. 4 is a flowchart illustrating the process or operation of the electric utility meter of FIG. 1 according to some embodiments.

FIG. 4 is a flowchart illustrating a process, or operation, 400 for detecting the occurrence of magnetic field tampering at electric utility meter 110. It should be understood that additional steps may be added and not all of the steps may be required. Additionally, although illustrated as occurring sequentially, some of the steps may be performed in parallel. The three-axis Hall Effect sensor 150 is configured to sense the magnetic field in two or more directions (in some embodiments, all directions) surrounding the electric utility meter 110 and transmit the sensed magnetic field data to controller 134 (block 405). The controller 134 determines whether an abnormal condition is present within the magnetic field proximate electric utility meter 110 (block 410). When an abnormal condition is present, the controller 134 determines the period of time for which the abnormal condition has been present (block 415). When the abnormal condition has been present for a predetermined period of time, the controller 134 adds a magnetic tampering event to an event log (block 420). In some embodiments, the controller 134 generates an alert when the abnormal condition has been present for a predetermined period of time.

In some embodiments, the three-axis hall-effect sensor 150 includes three separate Hall Effect elements oriented in different directions, for example, one being oriented in the x-direction along the x-axis, one being oriented in the y-direction along the y-axis, and one being oriented in the z-direction along the z-axis. Accordingly, the Hall Effect element oriented in the x-direction measures the magnetic field in the x-direction with respect to electric utility meter 110, the Hall Effect element oriented in the y-direction measures the magnetic field in the y-direction with respect to electric utility meter 110, and the Hall Effect element oriented in the z-direction measures the magnetic field in the z-direction with respect to electric utility meter 110. The measurements taken by each of the Hall Effect elements in the three-axis hall-effect sensor 150 may be individually processed by the controller 134. In other words, the controller 134 may be configured to receive a measurement of the x-axis component of the magnetic field proximate the electric utility meter 110, a measurement of the y-axis component of the magnetic field proximate the electric utility meter 110, an a measurement of the z-axis component of the magnetic field proximate the electric utility meter 110. Upon receipt of the three separate axis magnetic field measurements, the controller 134 may further be configured to calculate a vector magnitude using the three received measurements. The calculated vector magnitude may be indicative of an overall strength of the magnetic field proximate the electric utility meter 110. In some embodiments, the controller 134 is configured to calculate the vector angle associated with the received magnetic field measurements. In such embodiments, the calculated vector angle and magnitude are compared to a range of angles and magnitudes, which may be representative of fixed magnets placed around the electric utility meter 110.

Figure 5:
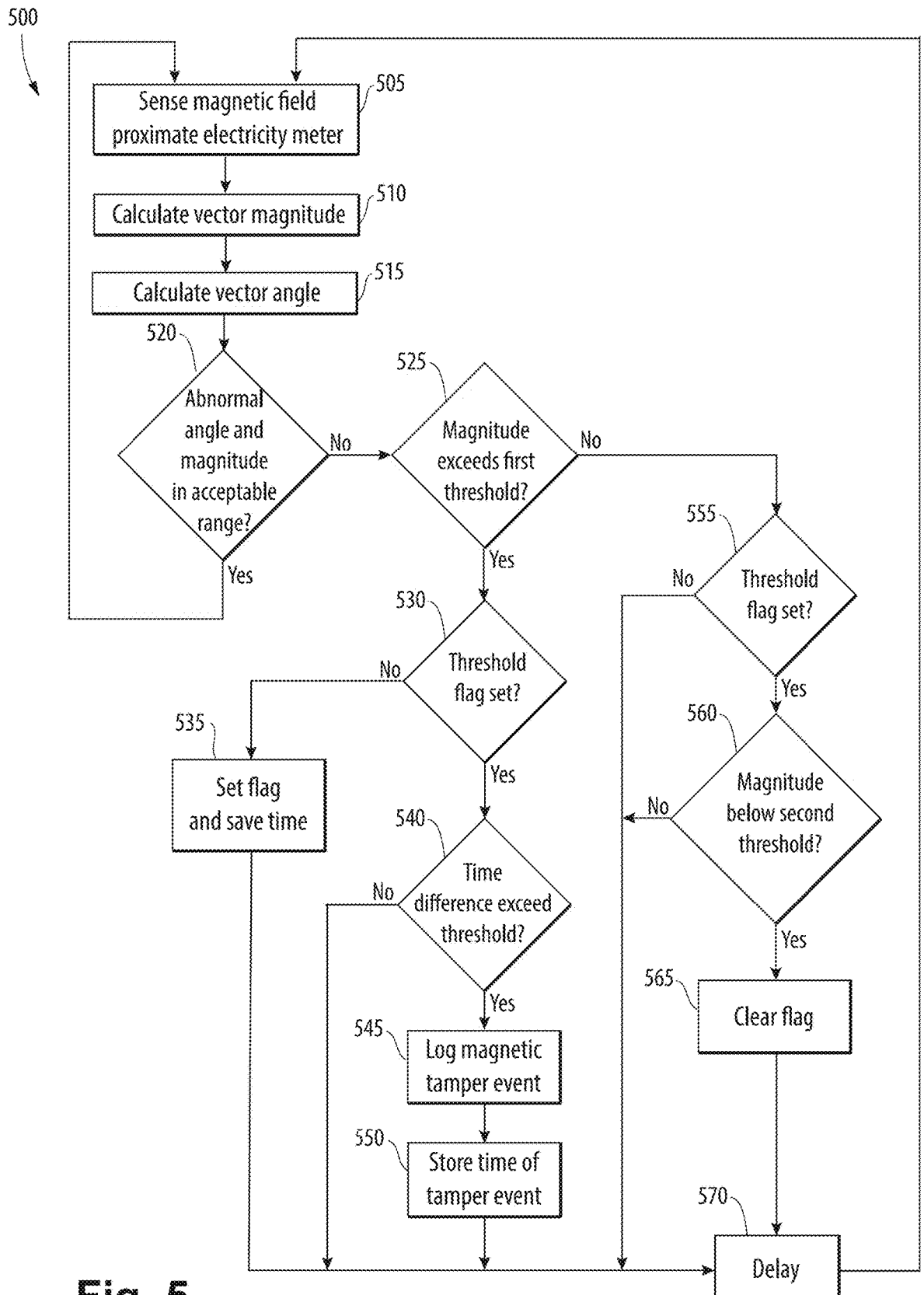
FIG. 5 is a flowchart illustrating the process or operation of the electric utility meter of FIG. 1 according to some embodiments.

FIG. 5 is a flowchart illustrating another process, or operation, 500 for detecting the occurrence of magnetic field tampering at electric utility meter 110. It should be understood that additional steps may be added and not all of the steps may be required. Additionally, although illustrated as occurring sequentially, some of the steps may be performed in parallel. The three-axis Hall Effect sensor 150 senses, via the three Hall Effect elements, the magnetic field in the x-axis, the y-axis, and the z-axis proximate the electric utility meter 110 and transmits the sensed magnetic field measurements to controller 134 (block 505). The controller 134 calculates a vector magnitude of the three axes magnetic field measurements received from the three-axis Hall Effect sensor 150 (block 510). The controller 134 calculates a vector angle of the three axes magnetic field measurements received form the three-axis Hall Effect sensor 150 (block 515). The controller 134 determines whether the calculated vector magnitude and angle values lie within an acceptable range of values (block 520). When the calculated vector magnitude and angle values are determined to be within an acceptable range, return to (block 505). When the calculated vector magnitude value or angle value is determined to be outside of an acceptable range, the controller 134 determines whether the calculated vector magnitude exceeds a first configurable threshold (block 525).

When the controller 134 determines that the calculated vector magnitude value exceeds the configurable threshold at (block 525), the process 500 proceeds to (block 530). At (block 530), the controller 134 determines whether the threshold flag is set (block 530), wherein the threshold flag indicates the detection of an abnormality (for example, increase in magnetic field strength) in the magnetic field. When the threshold flag is not set at (block 530), the controller 134 sets the threshold flag and saves the current time (block 535). In some embodiments, setting the threshold flag includes logging an abnormality detection event in the event log. After setting the threshold flag and saving the current time at (block 535), the process 500 proceeds to (block 570). When the threshold flag is set at (block 530), the controller 134 determines a difference between the current time and the time at which the flag was set (block 540). When the difference between the current time and the time at which the flag was set exceeds a defined period at (block 540), the controller 134 determines that a magnetic field tamper event has occurred and logs a magnetic field tamper event in the event log (block 545). In some embodiments, in addition to or instead of logging the magnetic field tamper event, the controller raises an alarm associated with the magnetic field tamper event. In some embodiments, in addition to or instead of logging a magnetic field tamper event, the controller generates an alert. Generating the alert may include transmitting an electronic message, such as a text message and/or email, indicating the occurrence of magnetic tampering to an external device associated with the electric utility provider.

At (block 550) the controller 134 stores the axes magnetic field measurements and the time at which the magnetic field tamper event occurred and process 500 proceeds to (block 565). When the difference between the current time and the time at which the flag was set does not exceed a defined period at (block 540), process 500 proceeds to (block 570).

When the controller 134 determines that the calculated vector magnitude value does not exceed the first configurable threshold at (block 525), the process 500 proceeds to (block 555). At (block 555), controller 134 determines whether the threshold flag is set (block 555). When the threshold flag is not set at (block 555), process 500 proceeds to (block 570). When the threshold flag is set at (block 555), the controller 134 determines whether the calculated vector magnitude value exceeds a second configurable threshold, the second configurable threshold being less than the first configurable threshold (block 560). When the controller 134 determines that the calculated vector magnitude value does not exceed the second configurable threshold at (block 560), the controller 134 clears the threshold flag (block 560) and the process 500 proceeds to (block 570). In some embodiments, clearing the threshold flag further includes logging an abnormality cleared event, which indicates the abnormal magnetic field is no longer proximate the electric utility meter 110, in the event log. In some embodiments, clearing the threshold flag further includes logging a magnetic field tamper cleared event, which indicates that magnetic tampering is no longer occurring proximate the electric utility meter 110, in the event log. When the controller 134 determines that the calculated vector magnitude value exceeds the second configurable threshold at (block 560), the process 500 proceeds to (block 570). At (block 570), process 500 delays for a configurable amount of time before returning to (block 505).

Thus, the disclosure provides, among other things, a system and method for detecting magnetic field tampering at an electric utility meter. Various features and advantages of the various embodiments disclosed herein are set forth in the following claims.

What is claimed is:

1. An electric utility meter comprising:
    a sensor configured to sense a magnetic field proximate the electric utility meter;
    a controller having an electronic processor, the controller configured to:
        receive, via the sensor, a signal indicative of a magnitude of the magnetic field proximate the electric utility meter;
        determine whether the magnitude of the magnetic field exceeds a first magnitude threshold;
        determine whether a threshold flag has been set;
        set the threshold flag when the threshold flag has not been set and the magnitude exceeds the first magnitude threshold;
        determine an amount of time for which the magnitude has exceeded the first magnitude threshold when the threshold flag has been set;
        generate an alert indicative of a magnetic tamper event when the amount of time exceeds a time threshold; and
        clear the threshold flag when the magnitude does not exceed a second magnitude threshold, the second magnitude threshold being less than the first magnitude threshold.

2. The electric utility meter of claim 1, wherein the magnetic field is generated by an external magnet approximately located at one selected from a group consisting of in front of the electric utility meter and to a side of the electric utility meter.

3. The electric utility meter of claim 1, wherein the sensor is a three-axis Hall Effect sensor configured to detect the presence of a magnetic field in a half sphere surrounding the electric utility meter.

4. The electric utility meter of claim 1, wherein the sensor is centrally located on a printed circuit board within a housing of the electric utility meter.

5. The electric utility meter of claim 1, wherein the controller is further configured to:
    determine whether the threshold flag is set when the magnitude does not exceed the first magnitude threshold; and
    determine whether the magnitude exceeds the second magnitude threshold when the threshold flag is set and the magnitude does not exceed the first magnitude threshold.

6. The electric utility meter of claim 1, wherein the controller is further configured to transmit the alert to an external device associated with a utility provider.

7. The electric utility meter of claim 1, wherein the alert is one selected from the group consisting of an electronic mail message and a text message.

8. The electric utility meter of claim 1, wherein the controller is further configured to generate a second alert that indicates the magnetic tamper event is no longer present when the magnetic tamper event is no longer detected.

9. A method for detecting an abnormality in a magnetic field proximate an electric utility meter, the method comprising:
    receiving, by a controller having an electronic processor, a signal indicative of a magnitude of a magnetic field proximate the electric utility meter from a sensor;
    determining, by the controller, whether a magnitude of the magnetic field exceeds a first magnitude threshold;
    determining, by the controller, whether a threshold flag has been set;
    setting, by the controller, the threshold flag when the threshold flag has not been set and the magnitude exceeds the first magnitude threshold;
    determining, by the controller, an amount of time for which the magnitude has exceeded the first magnitude threshold when the threshold flag has been set;
    generating, by the controller, an alert indicative of a magnetic tamper event when the amount of time exceeds a time threshold; and clearing the threshold flag when the magnitude does not exceed a second magnitude threshold, the second magnitude threshold being less than the first threshold.

10. The method of claim 9, wherein the magnetic field is affected by an external magnet approximately located at one selected from a group consisting of in front of the electric utility meter and to a side of the electric utility meter.

11. The method of claim 9, wherein the sensor is a three-axis Hall Effect sensor configured to detect the presence of a magnetic field in a half sphere surrounding the electric utility meter.

12. The method of claim 9, wherein the sensor is centrally located on a printed circuit board within a housing of the electric utility meter.

13. The method of claim 9, further comprising:
determining, by the controller, whether the threshold flag is set when the magnitude does not exceed the first magnitude threshold; and
determining, by the controller, whether the magnitude exceeds the second magnitude threshold when the threshold flag is set and the magnitude does not exceed the first magnitude threshold.

14. The method of claim 9, further comprising:
transmitting, by the controller, the alert to an external device associated with a utility provider.

15. The method of claim 9, wherein the alert is one selected from the group consisting of an email and a text message.

16. The method of claim 9, further comprising:
generating, by the controller, a second alert that indicates the magnetic tamper even is no longer present when the magnetic tamper even is no longer detected.

17. An electric utility meter comprising:
a sensor configured to sense a magnetic field proximate the electric utility meter;
a controller having an electronic processor, the controller configured to:
receive, via the sensor, a signal indicative of a magnitude of a magnetic field proximate the electric utility meter;
determine whether the magnitude of the magnetic field exceeds a first magnitude threshold;
determine whether a threshold flag has been set;
set the threshold flag when the threshold flag has not been set and the magnitude exceeds the first magnitude threshold;
determine an amount of time for which the magnitude has exceeded the first magnitude threshold when the threshold flag has been set;
generate a first alert indicative of a magnetic tamper event when the amount of time exceeds a time threshold; and
generate a second alert that indicates the magnetic tamper event is no longer present when the magnetic tamper event is no longer detected.

18. The electric utility meter of claim 17, wherein the controller is further configured to:
transmit the first alert to an external device associated with a utility provider; and
transmit the second alert to the external device associated with the utility provider.

19. The electric utility meter of claim 17, wherein the first alert is one selected from the group consisting of an email and a text message; and
wherein the second alert is one selected from the group consisting of an email and a text message.

20. The electric utility meter of claim 17, wherein the controller is further configured to display the first alert on a user-interface of the electric utility meter.

* * * * *